Figure 1:
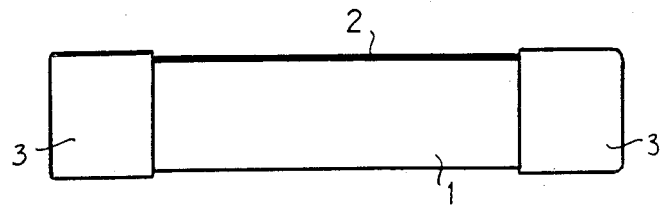

United States Patent [19]

Reynolds

[11] Patent Number: 4,646,057
[45] Date of Patent: Feb. 24, 1987

[54] METHOD OF MAKING CHIP RESISTORS AND IN THE CHIP RESISTORS RESULTING FROM THE METHOD

[75] Inventor: Quentin M. Reynolds, Guildford, United Kingdom

[73] Assignee: W. C. Heraeus GmbH, Hanau, Fed. Rep. of Germany

[21] Appl. No.: 702,021

[22] Filed: Feb. 15, 1985

[30] Foreign Application Priority Data

Feb. 15, 1984 [GB] United Kingdom ............... 8403968

[51] Int. Cl.$^4$ .............................................. H01G 1/14
[52] U.S. Cl. .................................... 338/312; 338/309;
29/620; 29/621; 29/842; 29/852; 427/102
[58] Field of Search ............... 338/295, 308, 309, 310, 338/312, 320; 357/40; 29/620, 621, 840, 852; 219/329, 543; 427/97, 101, 102; 361/404, 405

[56] References Cited

U.S. PATENT DOCUMENTS

| | | | |
|---|---|---|---|
| 2,886,476 | 5/1959 | Dumesnil et al. | 338/309 |
| 3,117,298 | 1/1964 | Grunwald | 338/312 |
| 3,495,133 | 2/1970 | Miller | 361/404 |
| 3,496,283 | 2/1970 | Andrasfay | 338/312 |
| 3,775,725 | 11/1973 | Endo | 338/312 |
| 4,127,934 | 5/1978 | Bartley et al. | 29/626 |
| 4,249,302 | 2/1981 | Crepeau | 29/830 |
| 4,294,648 | 10/1981 | Brede et al. | 338/309 |
| 4,320,165 | 3/1982 | Cash | 427/101 |
| 4,373,259 | 2/1983 | Motsch | 29/840 |
| 4,486,738 | 12/1984 | Sadlo et al. | 338/320 |

FOREIGN PATENT DOCUMENTS 190767 11/1982 Japan ................... 29/840

Primary Examiner—Percy W. Echols
Attorney, Agent, or Firm—Frishauf, Holtz, Goodman & Woodward

[57] ABSTRACT

A method of forming chip resistors in which a resistive coating is applied to an insulating substrate which is subsequently divided up into single chip components includes the step of providing end terminations for the individual chip resistors before the sheet is divided up. This is achieved by forming a hole 13 in the substrate 11 at the position of each end termination and then coating the holes with an electrically conductive material 14 which electrically connects with the adjacent region of the resistive coating 12. In order to improve the solderability and the reliability of the end terminations the holes 13 may be filled with solder 15. The electrical value of the resistive element coating may then be adjusted to a precise value by trimming away some of the resistive element material with a laser. Finally, the substrate is divided up into the single chip resistor components.

13 Claims, 5 Drawing Figures

U.S. Patent   Feb. 24, 1987   4,646,057

METHOD OF MAKING CHIP RESISTORS AND IN THE CHIP RESISTORS RESULTING FROM THE METHOD

The present invention relates to miniature electronic components and more particularly to chip resistors. These chip resistors are commonly mounted, together with other electronic components, on a flat surface such as a printed circuit board or ceramic substrate.

BACKGROUND

Chip resistors are presently manufactured by applying a resistive element coating or film onto a flat sheet of insulating material, after which the sheet is cut up or diced into single chip components. End connections are then applied and fired in to each chip resistor, either in the form of regions of metallisation or as wrap-round end terminations.

It is common practice to adjust the electrical value of the resistive element coating applied to the sheet of insulating material to a precise value before cutting up the sheet into the separate chip components. This adjustment is usually carried out by trimming away some of the resistive element material with the aid of a laser. The terminations forming the connection at each end of a chip resistor have therefore subsequently to be fired in at a relatively low temperature, since otherwise the precise value of the resistor would be affected. However the metals used for the end terminations sinter less well at these relatively low temperatures and it is therefore often necessary to carry out an additional plating operation in order to improve the reliability of the terminations.

THE INVENTION

It is an object of the present invention to provide an improved method of manufacturing chip resistors, and to provide improved chip resistors which can be readily assembled and soldered on a circuit board.

The present invention provides a method of forming chip resistors in which a resistive coating is applied to an insulating substrate sheet which is subsequently divided up into single chip components, which method includes the step of providing end terminations for the individual chip resistors before the sheet is divided up, by forming a hole in the substrate sheet at the position of each end termination and then coating the holes with an electrically conductive material which connects with the adjacent region of the resistive coating. Advantageously the electrically conductive material is applied by a through-hole metal contacting technique. In order to improve the solderability and the reliability of the end terminations the holes may be filled with solder by, for example, dipping the substrate in a solder bath. The electrical value of the resistive element coating may then be adjusted to a precise value by trimming away some of the resistive element material with a laser, as hitherto. Finally, and preferably after the individual resistors have been trimmed, the substrate sheet is divided up into the single chip resistor components.

The chip resistors so formed may thus be already pre-tinned for subsequent soldering and therefore ready for direct assembly onto a desired location such as a printed circuit board or ceramic substrate.

The invention also provides a chip resistor manufactured by the aforesaid method.

Figure 2A:
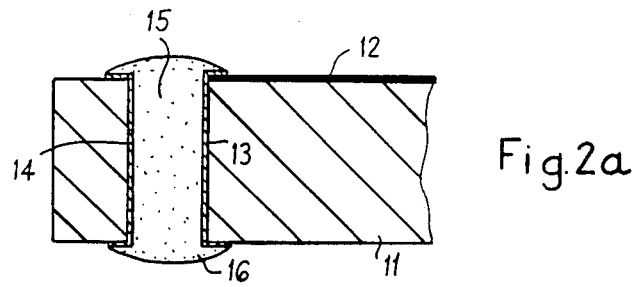
Figure 2:
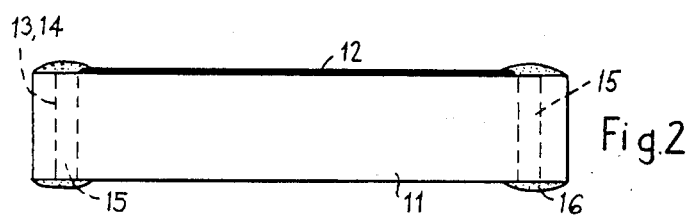
Figure 3A:
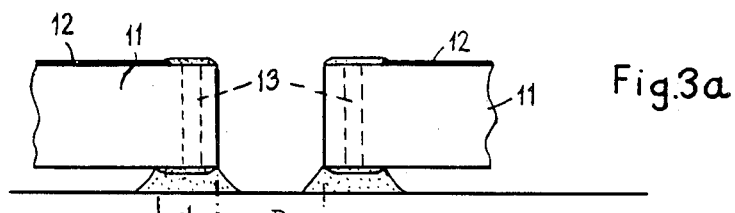
Figure 3B:
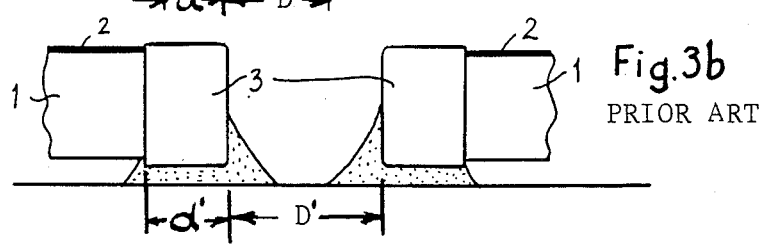

The invention will now be further described by way of example, with reference to the accompanying drawings, in which:

FIG. 1 is a view of a known type of chip resistor,
FIG. 2 is a view of a chip resistor according to the present invention,
FIG. 2a is an enlarged view in section of one end of the resistor of FIG. 2, and
FIGS. 3a and 3b illustrate how the possible packing density of chip resistors formed according to the present invention is greater than the packing density of prior art chip resistors.

It will be understood that the views shown in the drawing are both diagrammatic and to a greatly enlarged scale.

Referring to FIG. 1, a presently used construction of chip resistor comprises an insulating substrate 1 carrying a resistive element 2 in the form of a thick-film coating on one surface thereof and provided with end terminations 3. These end terminations are shown as wrap-round terminations but they could alternatively be regions of metallisation. However, in either case they are only applied to each individual resistor and fired in after the individual resistors have been divided from the large flat sheet of material which is initially formed.

As mentioned previously, if it is desired with this construction to adjust the electrical value of the resistive element coating by means of a laser, this has to be carried out before the sheet is cut up or diced into the single chip components, and the end terminations therefore have subsequently to be fired in at a relatively low temperature, since otherwise the precise resistor value would be affected.

FIGS. 2 and 2a show an embodiment of resistor formed by the method according to the present invention which again basically consists of a resistive element 12 in the form of a thick film of resistance material applied to a surface of a carrier or substrate 11 which is in sheet form. In the resistor of FIGS. 2 and 2a the end terminations are formed by means of through-holes 13 provided in the substrate sheet and coated with an electrically conductive material. This coating 14 may be a silver alloy applied by a through-hole metal coating technique. The coating 14 also extends over the area surrounding each end of the hole. This leaves the end surface or edge of the substrate free from coating material. Solder, thus, cannot creep over the edge—see FIG. 3a. The holes are then filled with solder 15 which connects both to the electrically conductive material 14 at both ends and to the resistive element and also forms a small contact region 16 at the end opposite to the resistive element. These end terminations are formed before the substrate sheet is cut into the individual resistors and the laser trimming of the resistive element material to a precise value can be carried out after the terminations have been formed.

FIG. 3a shows how chip resistors formed by the method according to the present invention occupy a smaller surface area and therefore allow for a greater component packing density on a printed circuit board or ceramic substrate as compared to the prior art chip resistors shown in FIG. 3b. As can be seen, this decrease in intercomponent distance, compare distances D and D' is chiefly due to the fact that the lengths of the end terminations d are defined by the through-holes 13 and solder region 16 within the overall length of the resistor, rather than by wrap-around terminations 3 with length d' added onto the ends of the resistor along which solder may creep (FIG. 3b).

It will be seen that the method of producing chip resistors according to the present invention and the resistors produced thereby have the following advantages:

(1) The laser trimming stage can be the last process in the manufacture of the chip resistors prior to cutting into individual resistors, thus improving the flexibility of the manufacturing process overall.
(2) The chip resistors are not cut out from the sheet until its manufacture is almost complete thus lowering the unit cost of production.
(3) The chip resistors each occupy a smaller surface area, therefore allowing for greater component packing densities on a printed circuit board or ceramic substrate.
(4) The additional plating step required with the known constructions due to low temperature sintering is no longer required.
(5) Since the soldered connection between a resistor and a circuit board involves only lateral metallisation, instead of partially vertical metallisation as occurs with the end soldering of wrap-round terminations of prior art constructions, the undesirable phenomenon known in the art as "tombstone effect" or "Manhattan effect" is completely eliminated. This effect can occur with the soldering of wrap-round terminations when the solder at one end of the resistor melts before the solder at the other end and the surface tension of the molten solder on the vertical face of the wrap-round connection at that one end acts to turn the resistor into a vertical position, so that it is substantially misplaced from its proper location.

I claim:

1. A method of making a chip resistor having
   an elongated substrate (11) of a predetermined length to define two substrate ends, said chip resistor having two end terminations which comprise
   a through-hole (13) formed adjacent, but inwardly of the ends of the substrate at the positions of the end terminations;
   a layer of resistive material (12) on the surface of the substrate (11) and extending up to the end terminations; and
   a coating (14) of electrically conductive material extending through the through-holes inwardly of the ends of the substrate, and electrically connected to the layer of resistive material, and over the zones of the substrate surface immediately adjacent the through-holes while leaving the end or edge surface of the substrate free from electrically conductive material,
   said method comprising the steps of
   providing a substrate (11) of predetermined length which defines said two substrate ends;
   forming two through-holes adjacent, but inwardly of the ends of the substrate;
   applying the layer of resistive material (12) to a surface of the substrate, said layer extending at least close to the through-holes in the region of the end terminations; and
   coating the through-holes with an electrically conductive material which electrically connects with the regions of the resistive layer adjacent the holes to form a coating (14) of electrically conductive material extending through the through-holes inwardly of the ends of the substrate and electrically connected to the layer of resistive material and over the zones of the substrate surfaces immediately adjacent the through-holes while leaving the end or edge surface of the substrate free from electrically conductive material.

2. The method of claim 1, for forming a plurality of chip resistors in which said step of providing said substrate comprises
   providing a substrate sheet capable of being divided into single substrates, and the step of providing the end terminations for the individual resistors is carried out before the sheet is divided.

3. The method of claim 2, including the step of
   adjusting the resistive value for each individual resistor by trimming the layer of resistive material after the steps of forming the holes in the substrate and coating the holes has been carried out, and prior to dividing the substrate sheet into individual resistors.

4. The method of claim 3, wherein the step of trimming the resistive layer comprises removing a part of the resistive layer by a laser beam.

5. The method of claim 1, wherein the electrically conductive material is applied by a through-hole metal contacting technique.

6. The method of claim 5, including the step of filling the through-holes with solder by immersion of the substrate into a solder bath.

7. The method of claim 1, further including the step of filling the coated through-holes with solder.

8. The method of claim 1, wherein the step of coating the holes with an electrically conductive material comprises coating the holes with a silver alloy.

9. A chip resistor having
   an elongated substrate (11) of a predetermined length, which defines two substrate ends, said chip resistor having two end terminations, comprising
   a through-hole (13) formed adjacent, but inwardly of the ends of the substrate at the positions of the end terminations;
   a layer of resistive material (12) on the surface of the substrate (11) and extending in the region of the end terminations;
   and a coating (14) of electrically conductive material extending through the through-holes inwardly of the ends of the substrate and electrically connected to the layer of resistive material, and over the zones of the substrate surfaces immediately adjacent the through-hole while leaving the ends or edge surfaces of the substrate free from electrically conductive material.

10. The resistor of claim 9, wherein said coating (14) of electrically conductive material comprises silver alloy.

11. The resistor of claim 10, further including a solder filling within the coated holes.

12. The resistor of claim 9, further including a solder filling within the coated holes.

13. A plurality of resistors, as claimed in claim 9, wherein said resistors have identical substrates, and said substrates have been divided or cut from a single substrate sheet and to thereby generate and provide said end or edge surfaces of the individual substrates free from electrically conductive material.

* * * * *